(12) United States Patent
Bytheway (10) Patent No.: US 10,845,917 B2
(45) Date of Patent: *Nov. 24, 2020

(54) TOUCH KEYBOARD

(71) Applicant: Cirque Corporation, West Valley City, UT (US)

(72) Inventor: Jared Bytheway, Salt Lake City, UT (US)

(73) Assignee: Cirque Corporation

( * ) Notice: Subject to any disclaimer, the term of this patent is extended or adjusted under 35 U.S.C. 154(b) by 0 days.

This patent is subject to a terminal disclaimer.

(21) Appl. No.: 16/690,471

(22) Filed: Nov. 21, 2019

(65) Prior Publication Data

US 2020/0089364 A1 Mar. 19, 2020

Related U.S. Application Data

(63) Continuation of application No. 15/860,563, filed on Jan. 2, 2018, now Pat. No. 10,528,180.

(51) Int. Cl.
*G06F 3/041* (2006.01)
*H03K 17/96* (2006.01)
*G06F 3/044* (2006.01)
*H03K 17/975* (2006.01)
*G07F 19/00* (2006.01)

(52) U.S. Cl.
CPC ............ *G06F 3/0416* (2013.01); *G06F 3/044* (2013.01); *H03K 17/9622* (2013.01); *H03K 17/975* (2013.01); *G07F 19/2055* (2013.01)

(58) Field of Classification Search
USPC ........................................ 345/173, 174, 214
See application file for complete search history.

(56) References Cited

U.S. PATENT DOCUMENTS

| | | | |
|---|---|---|---|
| 2015/0185920 A1* | 7/2015 | Reynolds | G06F 3/0416 345/174 |
| 2015/0309637 A1* | 10/2015 | Sakuishi | H01L 27/1214 345/174 |
| 2016/0132159 A1* | 5/2016 | Aoki | H01L 51/5237 345/174 |
| 2016/0179229 A1* | 6/2016 | Ahn | H01L 27/323 345/173 |
| 2016/0179259 A1* | 6/2016 | Watanabe | G06F 3/044 345/174 |
| 2016/0188083 A1* | 6/2016 | Shi | G06F 3/044 345/174 |
| 2016/0188098 A1* | 6/2016 | Her | G06F 1/1652 345/173 |
| 2016/0202810 A1* | 7/2016 | Ito | B32B 15/08 345/174 |
| 2016/0202812 A1* | 7/2016 | Pyoun | G06F 3/0412 345/173 |
| 2016/0253000 A1* | 9/2016 | Graumann | G06F 3/044 345/174 |
| 2016/0378224 A1* | 12/2016 | Kwon | H01L 27/322 345/174 |
| 2018/0024680 A1* | 1/2018 | Sakuishi | G06F 3/0443 345/174 |
| 2018/0237214 A1* | 8/2018 | Rayner | G06F 1/1656 345/173 |

* cited by examiner

*Primary Examiner* — Thuy N Pardo (57) ABSTRACT

A system and method that combines skimmer detection technology with a waterproof and sealed touch sensor keypad that may be used outdoors in wet environments, and is capable of being operated by a user wearing gloves.

20 Claims, 8 Drawing Sheets

TOUCH KEYBOARD

CROSS REFERENCE TO RELATED APPLICATIONS

This application is a continuation of U.S. patent application Ser. No. 15/860,563, which was titled Waterproof Touch Keypad with Skimmer Detection and filed on Jan. 2, 2018. U.S. patent application Ser. No. 15/860,563 is herein incorporated by reference for all that it teaches.

BACKGROUND

Field of the Invention

This invention relates generally to touch and proximity sensors. More specifically, the invention relates to a system and method for providing a waterproof touch sensor keypad that includes skimmer detection.

Description of Related Art

ATM's (Automated Teller Machines), Payment Card Equipment, Security System Interfaces and a variety of other systems require a secure interaction with a user. This system interaction may require the use of magnetic stripe readers, card readers (both contact and contactless), PIN entry or password entry keypads. A problem that occurs, most notably with ATM's and unattended payment card systems, is the illegal addition of third party information skimming devices for the purpose of stealing PIN and card information. The skimming devices used for data theft may be added internally to the card reader, or they may be added externally by making aesthetically appealing additions to the existing enclosure hardware. These additions may include the use of custom keypad overlays for the purpose of monitoring data entry of security access passcodes and PINs.

In order to maintain user confidence in these systems, greater measures have been taken to make the enclosures mechanically and electrically tamper resistant. Even with these countermeasures, it is still difficult to protect the physical card slots from the insertion of skimming devices because they are often open to the outside and tend to have small cavities where the skimming devices may be placed internally, or externally using custom molded housings that can be attached to the outside of the card reader slot. These add-on housings may contain voids that provide a location to hide the skimming devices.

Another possible point of attack is the placement of a skimming device on top of a keypad. For example, an overlay may be placed over a PIN or password entry keypad. An overlay enables the PIN or password data to be monitored with an additional finger position sensing system that does not interfere with the finger position sensing system already being used.

A touch sensor keypad skimmer may also be used in conjunction with a custom molded part or label to help hide the illicit hardware and associated wiring.

In order to detect the types of skimming devices described above, or other similar types of skimming devices, it is desirable to be able to detect small but measurable changes to the space inside or around the card reader, or the card reader enclosure. It is also desirable to be able to detect small but measurable changes to an exterior surface immediately adjacent to a card reader slot. It is also desirable to be able to detect small but measurable changes to a touch sensor data entry surface and the surrounding area.

In all of these skimming detection schemes, it is often the case that the operating environment of the touch keypads is outdoors, and thus the touch sensor keypads are often wet from rain, snow or condensation from humidity or fog. It would be an advantage over the prior art to provide a means for providing waterproofing of the touch sensor keypad when it also incorporates skimmer detection technology.

Some touch keypad technology that may be modified to operate with a waterproof skimmer detection system is taught by CIRQUE® Corporation. The CIRQUE® Corporation touchpad is a mutual capacitance-sensing device and an example is illustrated as a block diagram in FIG. 1. In this touchpad 10, a grid of X (12) and Y (14) electrodes and a sense electrode 16 is used to define the touch-sensitive area 18 of the touchpad. Typically, the touchpad 10 is a rectangular grid of approximately 16 by 12 electrodes, or 8 by 6 electrodes when there are space constraints. Interlaced with these X (12) and Y (14) (or row and column) electrodes is a single sense electrode 16. All position measurements are made through the sense electrode 16.

Figure 1:
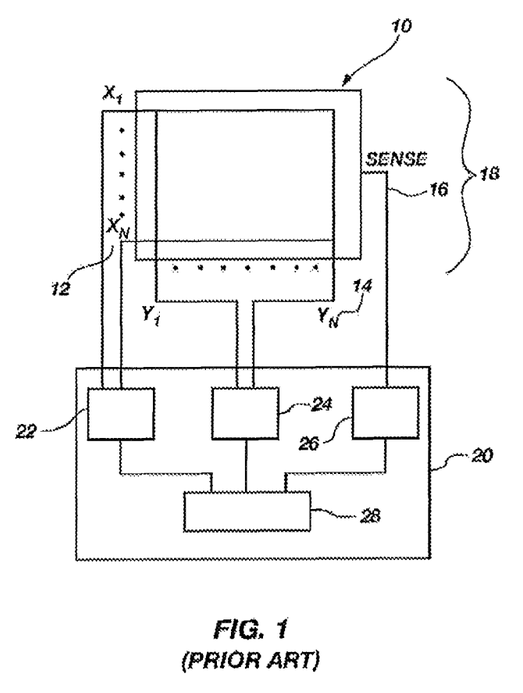
FIG. 1 is a block diagram of operation of a touchpad that is found in the prior art, and which is adaptable for use in the present invention.

The CIRQUE® Corporation touchpad 10 measures an imbalance in electrical charge on the sense line 16. When no pointing object is on or in proximity to the touchpad 10, the touchpad circuitry 20 is in a balanced state, and there is no charge imbalance on the sense line 16. When a pointing object creates imbalance because of capacitive coupling when the object approaches or touches a touch surface (the sensing area 18 of the touchpad 10), a change in capacitance occurs on the electrodes 12, 14. What is measured is the change in capacitance, but not the absolute capacitance value on the electrodes 12, 14. The touchpad 10 determines the change in capacitance by measuring the amount of charge that must be injected onto the sense line 16 to reestablish or regain balance of charge on the sense line.

The system above is utilized to determine the position of a finger on or in proximity to a touchpad 10 as follows. This example describes row electrodes 12, and is repeated in the same manner for the column electrodes 14. The values obtained from the row and column electrode measurements determine an intersection which is the centroid of the pointing object on or in proximity to the touchpad 10.

In the first step, a first set of row electrodes 12 are driven with a first signal from P, N generator 22, and a different but adjacent second set of row electrodes are driven with a second signal from the P, N generator. The touchpad circuitry 20 obtains a value from the sense line 16 using a mutual capacitance measuring device 26 that indicates which row electrode is closest to the pointing object. However, the touchpad circuitry 20 under the control of some microcontroller 28 cannot yet determine on which side of the row electrode the pointing object is located, nor can the touchpad circuitry 20 determine just how far the pointing object is located away from the electrode. Thus, the system shifts by one electrode the group of electrodes 12 to be driven. In other words, the electrode on one side of the group is added, while the electrode on the opposite side of the group is no longer driven. The new group is then driven by the P, N generator 22 and a second measurement of the sense line 16 is taken.

From these two measurements, it is possible to determine on which side of the row electrode the pointing object is located, and how far away. Using an equation that compares the magnitude of the two signals measured then performs pointing object position determination.

The sensitivity or resolution of the CIRQUE® Corporation touchpad is much higher than the 16 by 12 grid of row and column electrodes implies. The resolution is typically on the order of 960 counts per inch, or greater. The exact resolution is determined by the sensitivity of the components, the spacing between the electrodes 12, 14 on the same rows and columns, and other factors that are not material to the present invention. The process above is repeated for the Y or column electrodes 14 using a P, N generator 24.

Although the CIRQUE® touchpad described above uses a grid of X and Y electrodes 12, 14 and a separate and single sense electrode 16, the sense electrode can actually be the X or Y electrodes 12, 14 by using multiplexing.

It should be understood that the change in capacitance that is detected in the touch sensor described above is accomplished using a touch sensor controller that may detect an increase or a decrease in capacitance between two electrodes.

SUMMARY

In a first embodiment, the present invention is a system and method that combines skimmer detection technology with a waterproof and sealed touch sensor keypad that may be used outdoors in wet environments, and is capable of being operated by a user wearing gloves.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Unattended point-of-sale (POS) personal identification number (PIN) keypads that are often used at gas pumps and other outdoor applications may be subject to harsh environments that include moisture in the form of rain, snow, fog and humidity. These PIN keypads are prone to filling with dust, ice, drinks and other debris. They are also subject to having skimmers placed on them with little or no detection.

A capacitive touch sensor PIN keypad comprised of electrodes disposed in a switch array may solve the problem of having mechanical PIN keypads fill with debris because the touch sensor is sealed, but these touch sensors may lack water immunity. Furthermore, such touch sensors typically do not respond when used with thick winter gloves that a user does not want to remove to enter a PIN.

The embodiments of the invention are directed to providing a capacitive touch sensor PIN switch array that is capable of skimmer detection as well as providing additional protection against harsh weather conditions including protection against water that may interfere with operation of a prior art capacitive touch sensor PIN switch array.

Figure 2:
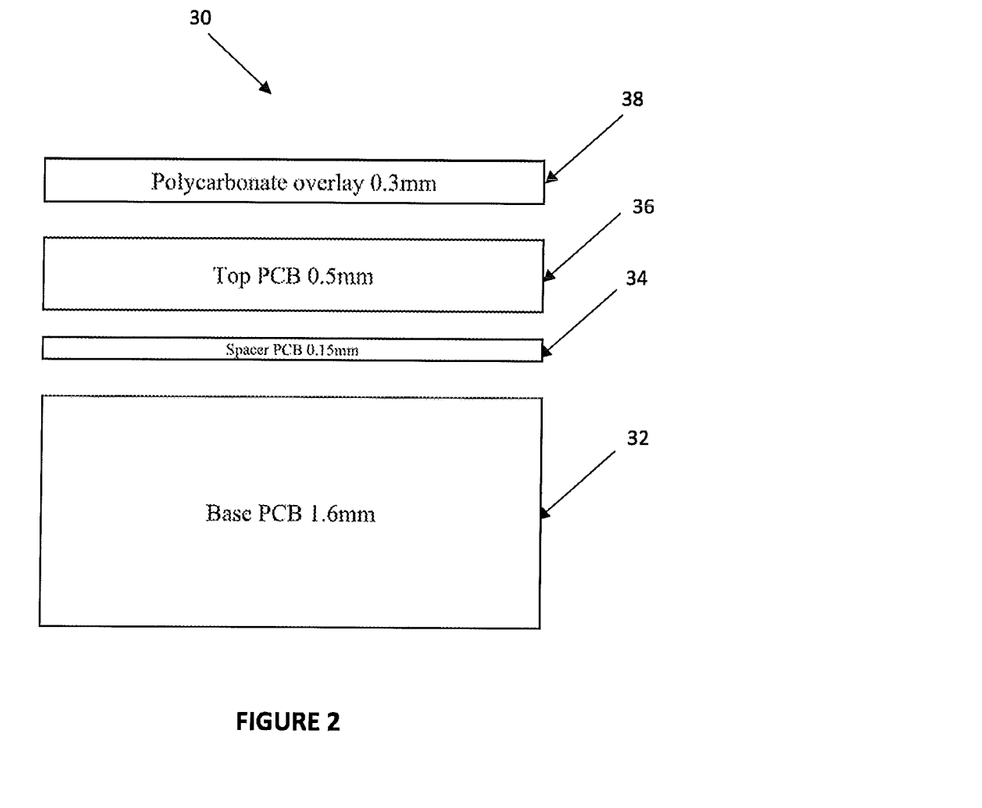
FIG. 2 is a profile view of the layers in a first embodiment of the invention.

FIG. 2 shows a profile view of a stack arrangement for a first embodiment of the invention of a capacitive touch sensor PIN switch array 30. This capacitive touch sensor PIN switch array 30 may also be referred to as the PIN keypad. The stack may include a base layer 32 comprised of a base PCB substrate, a thin spacer board layer 34, a top layer 36 comprised of a top PCB substrate, and an overlay 38. All of the layers in the stack may be planar and parallel to each other.

It should be understood that any suitable substrate material may be substituted for the PCB material of the base layer 32 and the top layer 36, and therefore the embodiments of the invention should not be considered as limited to PCB as the substrate material.

Figure 3:
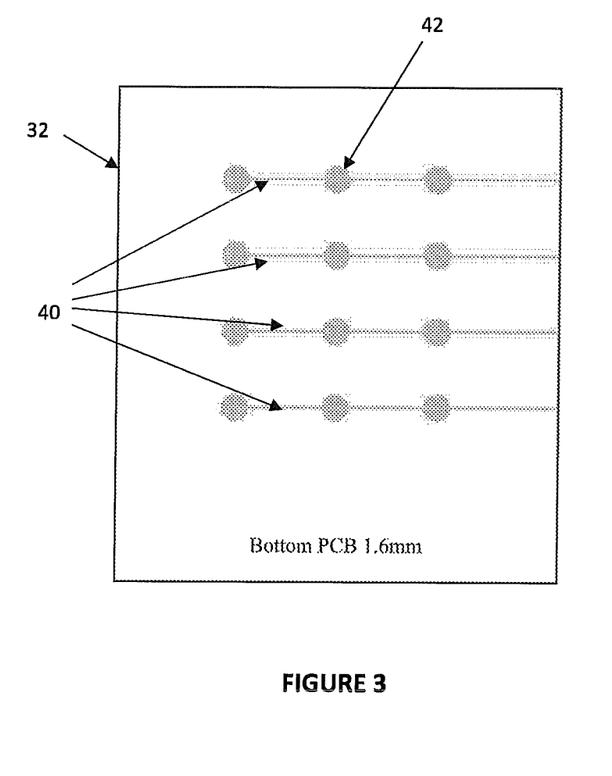
FIG. 3 is a top view of a base PCB layer in the first embodiment of the invention.

FIG. 3 is a top view of the base layer 32. Disposed on the base layer 32 are a plurality of conductive traces that form sense electrodes 40 of the capacitive touch sensor PIN switch array 30. The electrodes may function as sense electrodes and are shown in a parallel arrangement. However, the sense electrodes 40 do not have to be parallel, and this arrangement is for convenience only. Accordingly, the sense electrodes 40 may be disposed in other arrangements as long as they do not cross each other.

The capacitive touch sensor PIN switch array 30 may not require a complete XY electrode grid of a typical touch sensor capable of tracking movement of a finger. This is because all that is needed for a switch for each numerical digit of the PIN keypad 30 is the detection of a voltage and thus a change of capacitance within a specific area forming a switch of the capacitive touch sensor PIN switch array 30. Pressing on the overlay 38 will provide the indication that a numerical digit is being pressed as will be explained.

The thickness of the base layer 32 may typically be 1.6 mm thick, but may be any thickness that provides the desired function.

FIG. 3 shows a plurality of dots 42 made from the conductive material used for the sense electrodes 40. These dots 42 are part of each switch for each numerical digit of the PIN keypad 30 and are helpful in detecting a change in capacitance when a finger presses on the overlay 38. However, the dots are not required but are for convenience of the embodiments only in order to increase capacitive coupling between the plurality of sense electrodes 40 and the plurality of drive electrodes 46.

In this first embodiment, the plurality of sense electrodes 40 may be disposed in a horizontal arrangement. However, it should be understood that the plurality of sense electrodes 40 may also be disposed in a vertical arrangement and still function as desired. One electrode 40 is required for each row of switches in the capacitive touch sensor PIN switch array 30. If the PIN keypad 30 is disposed in a typical keypad arrangement, there will be four rows, but this is not a limitation of the first embodiment but is a design choice only of the PIN keypad 30 having 10 numerical digits. However, there may be more sense electrodes 40 than four if more rows are desired. For example, switches for buttons other than the 10 numerical digits may be desired on the capacitive touch sensor PIN switch array 30.

Figure 4:
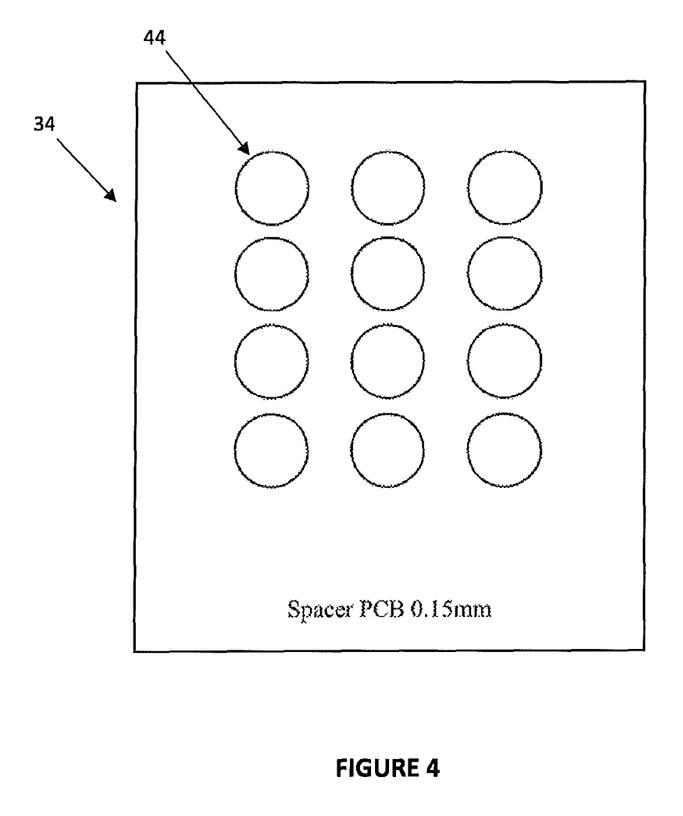
FIG. 4 is a top view of a spacer layer in the first embodiment of the invention.

FIG. 4 is a top view of the thin spacer board layer 34. The thin spacer board layer 34 includes a plurality of apertures 44 through the material forming the thin spacer board layer. The apertures 44 are formed over each of the plurality of dots 42 that form a switch on the base layer 32. The diameter of each of the plurality of apertures 44 is whatever is necessary such that a substrate may be at least slightly deflected down into an aperture when a user presses on a substrate over an aperture.

The thin spacer board layer 34 may be mounted directly on the base layer 32. The thin spacer board layer 34 may be comprised of a dielectric material such as a PCB or a polycarbonate film. In addition, the thickness of the thin spacer board layer 34 may be any thickness that gives separation between the base layer 32 and the top layer 36 but which will allow the deflection of a layer above.

The thickness of the thin spacer board layer 34 may typically be 0.15 mm thick, but may be any thickness that provides the desired function.

Criteria for determining thickness include that the thin spacer board layer 34 must be thin enough such that a small deflection in the top layer 36 creates an adequate change in capacitance in the sense electrodes 40 of the base layer 32 such that a touch sensing circuit may detect the capacitive change.

Figure 5:
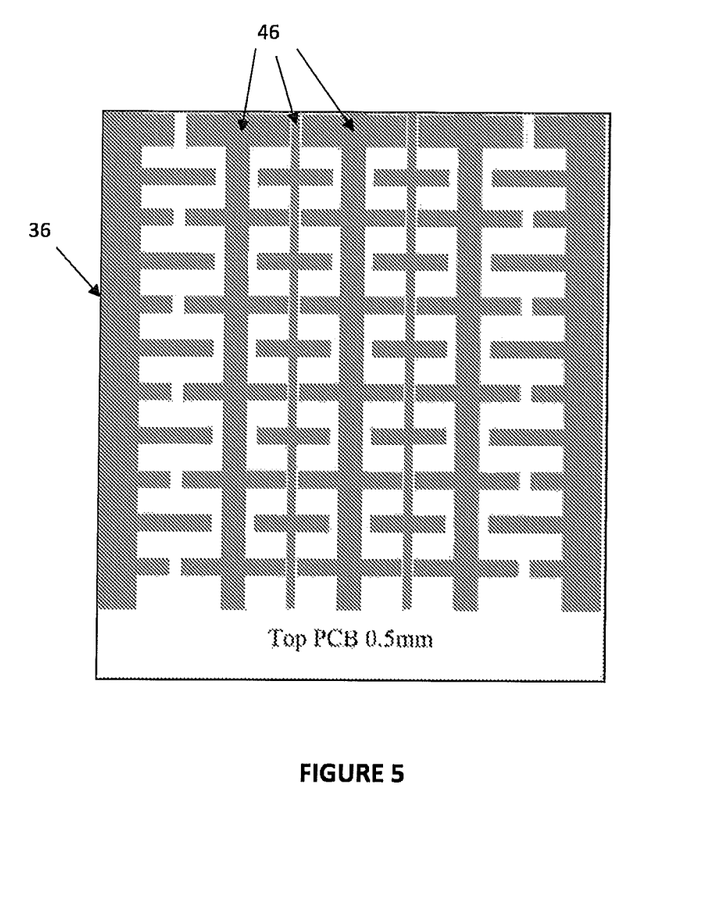
FIG. 5 is a top view of a top layer in the first embodiment of the invention.

FIG. 5 is a top view of the planar top layer 36. The top layer 36 includes a plurality of electrodes 46 that are disposed in a vertical arrangement that may be co-planar with but perpendicular to the plurality of sense electrodes 40. The top layer 36 may be mounted on the thin spacer board layer 34. These vertical electrodes 46 may be driven with a voltage such that the plurality of electrodes 40 that function as switches on the base layer 32 may sense the voltage and thus a change in capacitance on the plurality of electrodes 40.

The top layer 36 may be mounted on the thin spacer board layer 34. These vertical drive electrodes 46 may be driven with a voltage such that the plurality of sense electrodes 40 that together function as switches on the capacitive touch sensor PIN switch array 30 may sense the voltage and thus a change in capacitance on the plurality of sense electrodes 40.

The thickness of the top layer 36 may typically be 0.5 mm thick, but may be any thickness that provides the desired function of deflection when pressed.

The principle of operation of the first embodiment may be different from capacitive touch sensors of the prior art for several reasons. First, a prior art capacitive touch sensor may be detecting a change in capacitance on electrodes because a user's finger may cause a change in capacitance between two electrodes and may operate using touch alone. The finger may either cause an increase in capacitance due to the presence of a finger when using a self-capacitance touch sensor circuit, or the finger may cause a decrease in capacitance due to the presence of the finger in a mutual capacitance touch sensor circuit.

One aspect of the embodiments that is different from the prior art of touch sensors is that a finger touching the overlay 38 of the capacitive touch sensor PIN switch array 30 does not directly affect capacitance of the plurality of sense electrodes 40 so touch alone will not be sufficient to actuate a switch. Instead, the finger is pressing against the top layer 36 causing a slight deflection of this layer. This slight deflection causes the top layer 36 to move closer to the base layer 32 at an intersection of one of the plurality of drive electrodes 46 and one of the plurality of sense electrodes 40. The deflection of the top layer 36 is into one of the plurality of apertures 44 in the spacer board layer 34. A change in capacitance occurs at this intersection. This change in capacitance is detectable by a touch sensor controller 50 to be described.

There is more than one way for a detectable change in capacitance to be created in the capacitive touch sensor PIN switch array 30. For example, a touch sensor controller may transmit a signal to the top PBC layer 36 along each of the drive electrodes 46 in a sequential manner by sending a drive signal from a touch sensor controller.

Alternatively, the voltage on the drive electrodes 46 may be held constant, and the sense electrodes 40 may be sampled sequentially in order to determine the location of the deflection.

It should also be understood that the drive electrodes 46 may be allowed to electrically float, be grounded, or be held in a charged state, depending on the circumstances such as the type of touch sensor controller being used, where the system is being used and if other strong signals may be present that must be shielded from the sense electrodes 40 of the base layer 32.

What is important is that the finger is not directly causing the change in capacitance, but instead it is the deflection of the top layer 36. The advantages of this system and method are several. First, the system is still sealed to any outside contamination because at least the base layer 32, the thin spacer board layer 34 and the top layer 36 may be sealed to each other in a stacked arrangement and thereby sealing out any water or debris that might try to get between the layers 32, 34, 36. Second, because the finger does not cause the change in capacitance, any object may press on the top layer 36 and cause the change in capacitance. Thus, a user wearing a glove in cold weather does not need to remove it in order to operate the system. Third, the top layer 36 may function as a shield to strong signals that might otherwise cause a change in capacitance on the sense electrodes 40 of the base layer 32.

The first embodiment of the invention has been directed to a system where the sense electrodes 40 on the base layer 32 may function as sense electrodes for a touch sensor controller, while the drive electrodes 46 of the top PCB payer 36 may function as drive electrodes for a touch sensor controller.

However, in the alternative of a second embodiment of the invention, the functions of the base layer 32 and the top layer 36 may be reversed. Thus, the sense electrodes 40 of the base layer 32 may function as drive electrodes and the drive electrodes 46 of the top layer 36 may function as sense electrodes. However, the first embodiment may be preferable in order to shield the sense electrodes from stray signals from outside the system.

Figure 6:
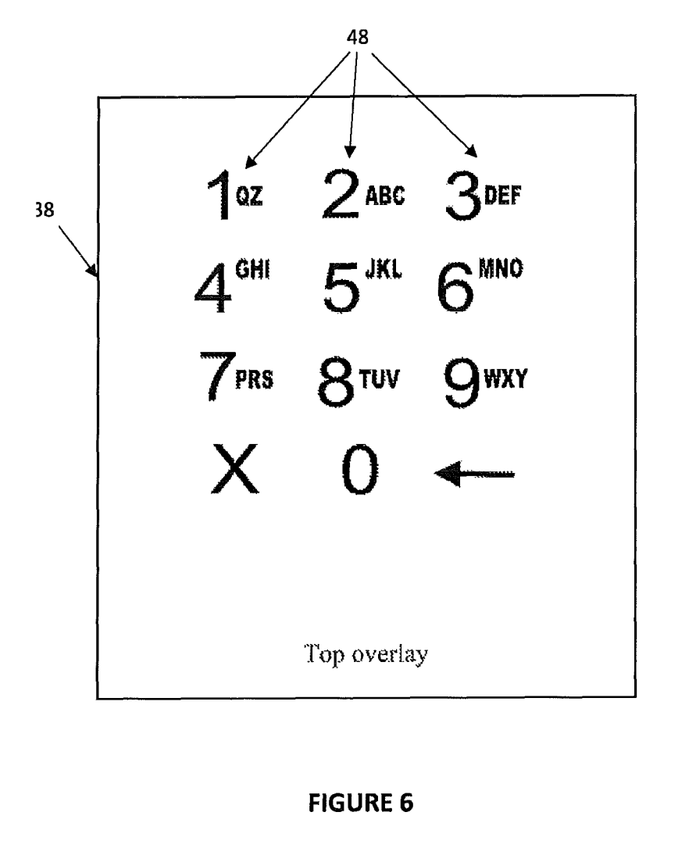
FIG. 6 is a tope view of an overlay of the first embodiment of the invention.
Figure 7:
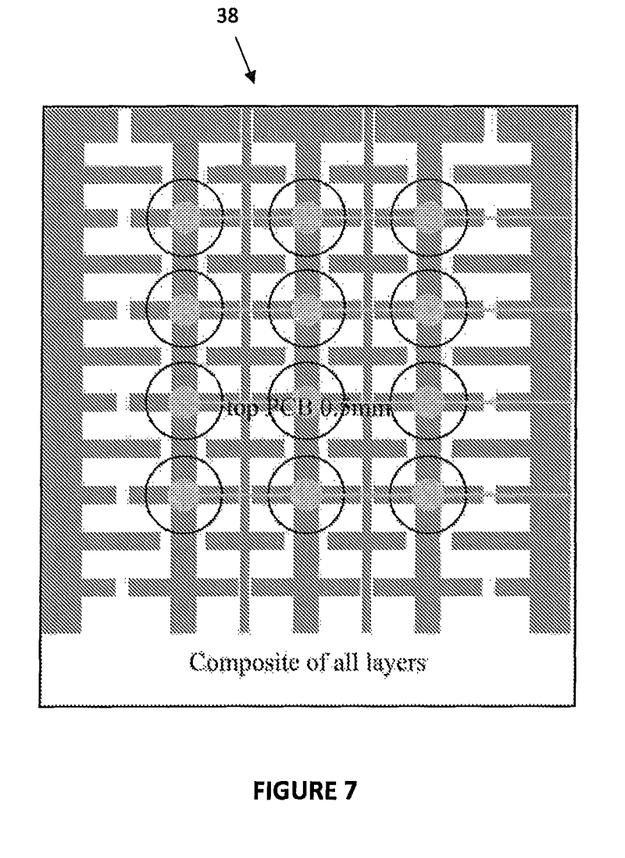
FIG. 7 is a top view of all of the layers shown in FIGS. 2 through 6 of the first embodiment of the invention.

FIG. 6 is a top view of the overlay 38. The overlay 38 may be disposed on the top layer 36 to provide a visual guide to the locations and functions of the switches in the system by disposing buttons 48 on the overlay. The buttons 48 may be disposed over and aligned with the apertures 44 in the thin spacer board layer 34, and thus also be aligned with the intersections of the sense electrodes 40 in the base layer 32 and the electrodes 36 in the top layer 36. The buttons 48 are not mechanical buttons, but serve only as a guide to where the user should press on the overlay 38.

The overlay 38 may be comprised of materials such as polycarbonate, glass or any other material that may protect the top layer 36 from harsh environmental conditions, but still allow the top layer 36 to flex as a button 48 is being pressed. Thus, the overlay 48 should also be a flexible material that does not interfere with movement of the top layer 36.

Regarding more specific measurements that may be performed using the embodiments of the present invention, two different measurement types may be performed. The first type of measurement may be for sensing a change in space between the top layer 36 and the base layer 32 as a result of a user pressing on the overlay 38. One sequence of events may be to sequentially energize each of the drive electrodes 46 in the top layer 36. A touch sensor controller coupled to the sense electrodes 40 of the base layer 32 may then process a signal to determine which of the buttons 48 on the overlay 38 are being depressed by a user.

The second type of measurement may be done in order to perform the function of skimmer detection. In this measurement, certain drive electrodes 46 on the top layer 36 may be stimulated while different electrodes on the top layer are sensing. Thus, the touch sensor controller may be coupled to the sense electrodes 40 of the base layer 32 and to the drive electrodes 46 of the top layer 36 in order to be able to switch between the different types of measurements.

It is an aspect of the embodiments of the invention that multiple measurements may need to be performed with different configurations of the drive electrodes 46 functioning as drive electrodes and sense electrodes to thereby maximize the 'visibility' of what may be above the top layer 36. If a skimmer device is attached above the top layer 36, the electric field of the top layer would be altered and can be detected by a touch sensor controller. It is understood that this measurement system may detect skimmer devices that are created using conductors and dielectrics.

In order to determine that the electric field has been altered around the top layer 36, it may be necessary to make a baseline recording of the voltages of the top layer during normal operation. This may be a calibration step that takes place when the system is installed. The system may then check a current measurement from the plurality of sense electrodes against the baseline measurement to determine if there is a change in the electric field of the top layer 36.

In another aspect of the embodiments of the invention, there may be additional electrodes on the top layer 36 that are not used for switches but are instead dedicated to skimmer device detection. These electrodes and measurements may typically be used to detect the presence of a skimming device that may have been attached above the overlay 38.

Figure 8:
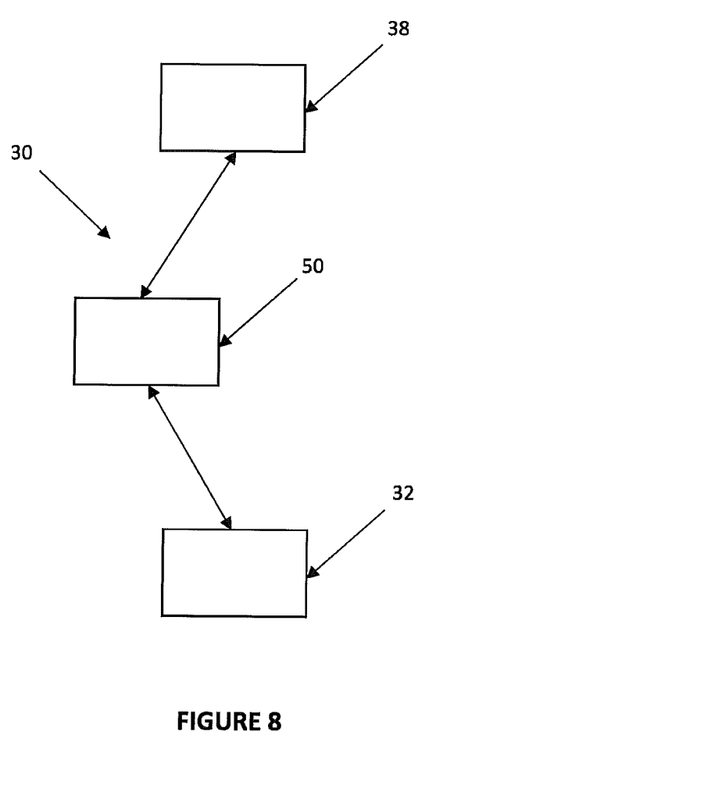
FIG. 8 is a schematic block diagram of a touch sensor controller that is coupled to a base layer and the top layer.

FIG. 8 is provided as a schematic block diagram that illustrates the aspect of the embodiments of the invention that a touch sensor controller 50 is coupled to the sense electrodes 40 of the base layer 32 and the drive electrodes 46 of the top layer 36. The touch sensor controller may generate drive signals and may receive sense signals and determine a change in capacitance. The touch sensor controller 50 may send either type of signal to any of the base layer 32 sense electrodes 40 and the top layer 36 drive electrodes 46. The touch sensor controller 50 may also send drive signals and receive sense signals to dedicated skimmer detection electrodes on the top layer 36.

In summary, at least one of the embodiments of the invention is directed to a system for providing a touch sensor that includes water protection and enables a user wearing non-conductive materials to operate it. The touch sensor system may be comprised of a base layer comprised of a planar substrate and a plurality of parallel sense electrodes disposed thereon, a planar spacer board layer disposed on top of and sealed to the base layer, and wherein the spacer board layer includes a plurality of apertures through the spacer board layer, and a top layer disposed on top of and sealed to the spacer board layer and comprised of a planar substrate, wherein the top layer includes a plurality of parallel drive electrodes that are coplanar but perpendicular to a direction of the sense electrodes.

The system may also include an overlay disposed on top of the top layer, wherein the top layer includes a display showing a plurality of buttons.

Intersections of the sense electrodes and the drive electrodes form switches, wherein each of the plurality of apertures in the spacer board layer and each of the buttons on the overlay are disposed at each of the intersections that a button is desired.

A deflection of the top layer over any of the plurality of apertures that is over an intersection will result in a detectable change in capacitance at the intersection and the identification of a button that is being pressed on the overlay. In addition, the top layer, the spacer board layer and the top layer are sealed to prevent entry of moisture.

In another aspect of the embodiments, pressing on a button on the overlay with a nonconductive object and still causing a detectable change in the associated intersection.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. § 112, paragraph 6 for any limitations of any of the claims herein, except for those in which the claim expressly uses the words 'means for' together with an associated function.

The invention claimed is:

1. A touch sensor, comprising:
   a base layer comprised of a substrate and a plurality of sense electrodes disposed thereon;
   a spacer layer disposed on top of the base layer, and wherein the spacer layer includes a plurality of apertures through the spacer layer;
   a top layer disposed on the spacer layer and comprised of a substrate, wherein the top layer includes a plurality of drive electrodes; and
   an overlay disposed on the top layer, wherein the top layer includes a display showing a plurality of buttons;
   wherein an intersection of the sense electrodes and the drive electrodes forms a switch, wherein at least one of the plurality of apertures in the spacer layer and at least one of the buttons on the overlay is disposed at the intersection, wherein a deflection of the top layer over the intersection results in a detectable change in capacitance at the button.

2. The touch sensor of claim 1, wherein the touch sensor further comprises PCB as a material of the base layer and the top layer that enables the top layer to flex when it is pressed.

3. The touch sensor of claim 1, wherein the touch sensor is further comprised of a dot of conductive material disposed on at least one of the sense electrodes where a switch is formed by overlapping one of the plurality of drive electrodes.

4. The touch sensor of claim 1, wherein the spacer layer is selected from the group of dielectric materials comprised of PCB and polycarbonate film.

5. The touch sensor of claim 1, wherein the touch sensor further comprises a touch sensor controller coupled to the plurality of sense electrodes and to the plurality of drive electrodes.

6. The touch sensor of claim 1, wherein the touch controller is capable of sequentially transmitting drive signals to the plurality of drive electrodes to determine a location of the deflection of the top layer.

7. The touch sensor of claim 1, wherein the plurality of drive electrodes is charged and forms a shield that prevents stray signals from reaching the plurality of sense electrodes.

8. The touch sensor of claim 1, wherein the material of the overlay is selected from the group of materials comprised of polycarbonate and glass.

9. The touch sensor of claim 1, wherein the touch sensor is further comprised of a plurality of dedicated drive and sense electrodes to detect a skimmer.

10. The touch sensor of claim 1, wherein the capacitance is self-capacitance.

11. The touch sensor of claim 1, wherein the capacitance is mutual capacitance.

12. A method for providing a touch sensor, comprising:
providing a base layer having sense electrodes disposed thereon, a spacer layer disposed on the base layer, and wherein the spacer layer includes a plurality of apertures through the spacer layer, and a top layer disposed on the spacer layer, wherein the top layer includes a plurality of drive electrodes;
providing an overlay disposed on top of the top layer, wherein the top layer includes a display showing a button, wherein an intersections of the sense electrodes and the drive electrodes form a switch, wherein at least one of the apertures in the spacer layer and the button on the overlay is disposed at the intersection; and
detecting a change in capacitance when the top layer over the intersection is deflected.

13. The method of claim 12, wherein detecting a change in capacitance occurs when the button is pressed on the overlay with a non-conductive object.

14. The method of claim 12, wherein the method further comprises detecting the change in capacitance at the intersection between the sense electrodes and the plurality of drive electrodes by using a touch sensor controller that is coupled to the plurality of sense electrodes and to the plurality of drive electrodes.

15. The method of claim 12, comprising sequentially transmitting drive signals to the plurality of drive electrodes using the touch sensor controller to determine a location of the deflection of the top layer.

16. The method of claim 12, further comprising charging the plurality of drive electrodes in the top layer to form a shield against unwanted signals from reaching the plurality of sense electrodes.

17. The method of claim 12, wherein a finger touching the overlay does not directly affect the capacitance, but wherein a slight deflection of the top layer from the finger causes the change in capacitance.

18. The method of claim 12, further comprising sampling a constantly held voltage on the drive electrode to determine the location of the deflection.

19. The method of claim 12, further comprising storing a baseline measurement of the voltages and/or capacitance values of the top layer.

20. The method of claim 19, further comprising comparing the baseline measurement with a current measurement to detect a skimmer.

* * * * *